United States Patent
Hoffmann et al.

(10) Patent No.: US 6,317,356 B1
(45) Date of Patent: Nov. 13, 2001

(54) CONFIGURATION FOR SELF-REFERENCING FERROELECTRIC MEMORY CELLS

(75) Inventors: Kurt Hoffmann, Taufkirchen; Oskar Kowarik, Neubiberg, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/693,764

(22) Filed: Oct. 20, 2000

(30) Foreign Application Priority Data

Oct. 20, 1999 (DE) .............................. 199 50 581

(51) Int. Cl.⁷ .................................................. G11C 11/22
(52) U.S. Cl. .............................................. 365/145; 365/65
(58) Field of Search .......................... 365/145, 189.07, 365/65, 149

(56) References Cited

U.S. PATENT DOCUMENTS 5,218,566 * 6/1993 Papaliolios ......................... 365/145
6,195,281 * 2/2001 Kim ................................... 365/145
6,198,654 * 3/2001 Ashikaga ........................... 365/145
6,246,602 * 6/2001 Nishimura ......................... 365/145

FOREIGN PATENT DOCUMENTS 41 10 407 A1  10/1991 (DE) .
0 359 404 B1  3/1990 (EP) .

OTHER PUBLICATIONS

Yamada et al.: "A Self–Reference Read Scheme for a 1T/1C FeRAM", Symposium on VLSI Circuits Digest of Technical Papers 1998, pp. 238 to 241.

* cited by examiner

Primary Examiner—Tan T. Nguyen
(74) Attorney, Agent, or Firm—Herbert L. Lerner; Laurence G. Greenberg; Werner H. Stemer (57) ABSTRACT

A configuration for self-referencing a ferroelectric memory cell reads out the ferroelectric memory cell successively while a bit line is precharged to two different, opposing voltages. The voltage values read out from the ferroelectric memory cell are temporarily stored respectively in a first and a second capacitor and then fed to an evaluator circuit.

13 Claims, 10 Drawing Sheets

CONFIGURATION FOR SELF-REFERENCING FERROELECTRIC MEMORY CELLS

BACKGROUND OF THE INVENTION

FIELD OF THE INVENTION

This invention concerns a configuration for self-referencing a ferroelectric memory cell which is formed of a ferroelectric storage capacitor with a cellplate and a transfer transistor. The ferroelectric memory cell is provided in a memory cell array controlled via word lines and bit lines. The ferroelectric storage capacitor is provided between a cellplate line and the transfer transistor. In order to perform a self-referencing with an evaluator circuit, the memory cell is written-in and read-out again after a read process for determining a reference voltage.

Figure 18:
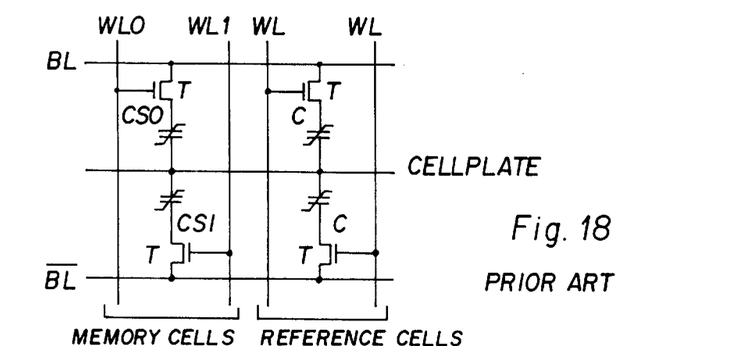
FIG. 18 is a circuit diagram for explaining the layout of a memory cell array in a FeRAM according to the prior art.

As illustrated in FIG. 18, in prior art ferroelectric memories memory cells of ferroelectric storage capacitors Cs0, Cs1 and transfer transistors T are provided between bit lines BL and word lines WL0, WL1. The cellplates of the memory cells can be connected to one another either parallel to the bit lines, as shown in FIG. 18, or parallel to the word lines WL0, WL1, but can also be provided such that they are connected in both directions.

Figure 17:
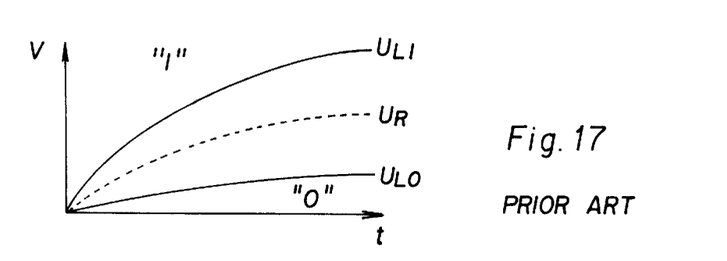
FIG. 17 is a graph illustrating the read-out of a "1" or a "0" in a ferroelectric memory (FeRAM) according to the prior art.

On reading out the content of such a ferroelectric memory cell the bit line BL acquires a read voltage of $U_{L1}$ or $U_{L0}$ depending on whether a "1" or a "0" is read out (cf. also FIG. 17). The voltage difference between the read voltages $U_{L1}$ and $U_{L0}$ is normally in the region of 100 mV.

The task of an evaluator circuit—also known as an "evaluator"—is to detect the read voltage $U_L$ on the bit line BL as "1" (i.e. $U_{L1}$) or "0" (i.e. $U_{L0}$) and to amplify it accordingly. The detection takes place through comparison of the read voltage $U_L$ with a reference voltage $U_R$. If the read voltage is greater than the reference voltage $U_R$, a "1" is detected; if it is smaller than the reference voltage $U_R$ a "0" is detected.

In the prior art, in most cases this is achieved through generating the reference voltage on a reference bit line $\overline{BL}$ by reading out the content of a reference cell formed of a ferroelectric storage capacitor C and a transfer transistor T, whereby this reference cell is dimensioned and/or connected such that the reference voltage $U_R$ is produced in a suitable way.

It is also important that the reference voltage $U_R$ be exact to within a few mV and as close as possible to the middle position between the read voltages $U_{L1}$ for "1" and $U_{L0}$ for "0".

This requirement, however, causes considerable problems in the generation of the reference voltage $U_R$ during operation of the ferroelectric memory:

(a) The read voltage $U_L$ of the ferroelectric memory cells and the reference voltage $U_R$ of the reference cells are already scattered simply as a result of the manufacturing process, which cannot proceed in exactly the same way for all memory cells.

(b) Depending on the number of write and read cycles, the electrical characteristics of the ferroelectric memory cells and the reference cells change as a result of the "aging" characteristics (hysteresis curve becomes narrower), "fatigue" (hysteresis curve rotates) and "imprint" (hysteresis curve is displaced up or down), whereby this aging process progresses differently for the two types of cell.

As a consequence of the above problems (a) and (b), the read voltage $U_L$ and/or the reference voltage $U_R$ can be displaced to such an extent that correct evaluation of the read voltage $U_L$ as a "1" or a "0" during operation of the ferroelectric memory is no longer possible.

In order to avoid the above difficulties, a self-referencing of a memory cell is described in the article "A Self-Reference Read Scheme for a 1T/1C FeRAM", by J. Yamada et. al., 1998 Symposium on VLSI Circuits Digest of Technical Papers, pp. 238 and 239, according to which the problem of differential aging of a memory cell and a reference cell is avoided. In this conventional self-referencing method, however, circuit measures such as different bit line capacities or evaluator circuits are used for generating the reference voltage, which results again in a dependence on the aging of the memory cells.

SUMMARY OF THE INVENTION

It is accordingly an object of the invention to provide a configuration for self-referencing a ferroelectric memory cell which overcomes the above-mentioned disadvantages of the heretofore-known configurations of this general type and in which there is no dependency on the aging of the memory cell and for which the hysteresis range is utilized as much as possible for a determination of the reference voltage.

With the foregoing and other objects in view there is provided, in accordance with the invention, a configuration for self-referencing a memory cell, including:

a ferroelectric memory cell including a ferroelectric storage capacitor and a transfer transistor, the ferroelectric storage capacitor having a cellplate;

a bit line connected to the ferroelectric memory cell, the bit line being precharged with a first voltage having a first voltage value and subsequently with a second voltage having a second voltage value, the first and second voltages being opposite and different from one another;

a cellplate line, the ferroelectric storage capacitor being connected between the cellplate line and the transfer transistor;

a first capacitor and a second capacitor, the first capacitor temporarily storing a first read-out voltage value read from the ferroelectric memory cell while the bit line is precharged with the first voltage value, and the second capacitor temporarily storing a second readout voltage value read from the ferroelectric memory cell after the bit line is precharged with the second voltage value; and an evaluator circuit connected to the first capacitor and to the second capacitor, the evaluator circuit receiving the first and second read-out voltage values after being temporarily stored by the first and second capacitors, the evaluator circuit comparing the first and second read-out voltage values for determining a stored cell content by self-referencing the ferroelectric memory cell.

In other words, the object of the invention is achieved with a configuration in which the memory cell can be read-out in a successive manner, while the bit line is precharged to two different voltages with a first and respectively a second voltage value, and each of the thus determined voltage values can be stored in a first and respectively a second capacitor before it is fed to the evaluator circuit.

In a first embodiment the cellplate line can be supplied with a fixed supply voltage, whereby the cellplate can be configured connected or coherent over the entire memory array formed from the memory cells, or, in a different embodiment, can have applied to it a voltage of a second or first voltage value if a voltage with the first or second voltage value is applied to the bit line. The second embodiment of a pulsed cellplate line has the advantage of preventing the occurrence of parasitic diodes in the memory cells.

In the case of pulsed cellplates, these can be connected together in lines parallel to the bit lines, whereby the reference voltage is available on the cellplate line.

Alternatively, it is possible to connect the cellplates together in lines parallel to the word lines and to extract the reference voltage on the bit line.

In accordance with another feature of the invention, the transfer transistor is blocked after the bit line is precharged with the first voltage.

In accordance with yet another feature of the invention, a respective one of the cellplate lines is used jointly by respective two of the bit lines.

In accordance with yet a further feature of the invention, the bit lines are crossed at least once with the cellplate lines.

In accordance with another feature of the invention, the bit line is precharged with a supply voltage as the first voltage and with 0 V as the second voltage.

In accordance with yet another feature of the invention, a memory cell array is formed from the ferroelectric memory cells, and the memory cell array is controlled by the word lines and the bit lines.

In contrast to the method of self-referencing according to the teaching of Yamada, in which only half of the hysteresis curve is used, the configuration according to the invention makes use of the entire range of the hysteresis curve, as is explained in detail below. Moreover, in generating the reference voltage through the configuration according to the invention, all dependence on the technology used is avoided and there is no dependence on different aging characteristics since the respective memory cell read out is also used as the reference cell.

Other features which are considered as characteristic for the invention are set forth in the appended claims.

Although the invention is illustrated and described herein as embodied in a configuration for self-referencing ferroelectric memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention is described with reference to the figures of the drawings, in which the same labels are used for corresponding components. FIGS. 17 and 18 have already been discussed above.

The first exemplary embodiment according to the invention relates to a configuration for self-referencing with a fixed cellplate voltage, whereas the second and the third exemplary embodiment concern configurations with a pulsed cellplate voltage.

As in the case of the teaching of Yamada, generation of the reference voltage $U_R$ in the configuration according to the invention initially involves the respective use of the same memory cell as was already used previously for a read-out of a stored "1" or "0". As explained in detail below and already stated above, the invention achieves the following important advantages, in particular when compared with the teaching of Yamada:

(a) There is no dependence on different aging phenomena for the read-out memory cell and the reference cell because the same cell is used in each case.

(b) The differential voltage $U_L-U_R$ available for evaluation is considerably greater and can be as high as approximately double the value of prior art differential voltages for cells of the same size.

In the configuration according to the invention the first step I involves applying, for example, a supply voltage VCC to a bit line BL (cf., for example, FIG. 4); next, the content of an addressed memory cell is read-out on this bit line BL through activation of a word line WL. At this point a cellplate CP of a ferroelectric storage capacitor FCS should be fixed at a reference voltage $V_{ref}=V_{cellplate}=VCC/2$. This means that the cellplate CP is fixed at 1.5 V if the supply voltage VCC=3 V.

Figure 4:
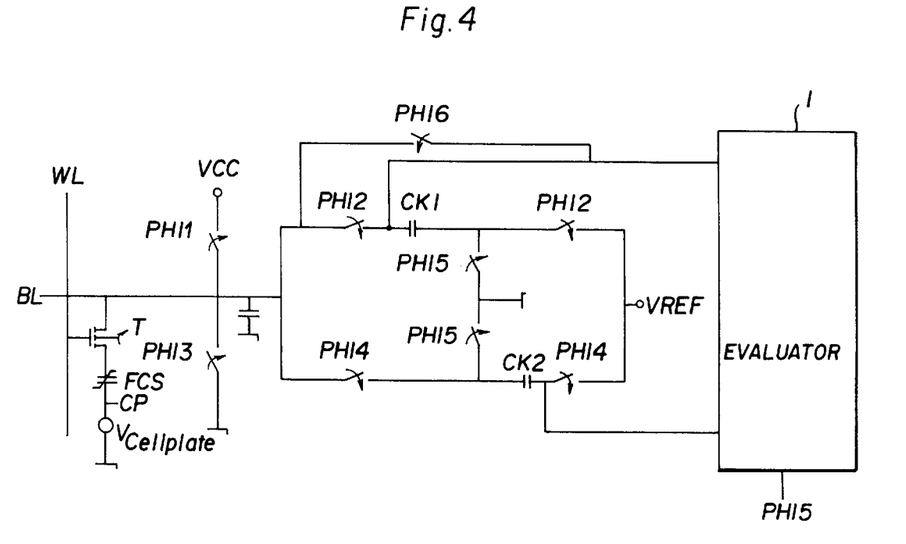
FIG. 4 is a schematic circuit diagram illustrating the first exemplary embodiment according to the invention.

The voltage $\Delta U_L$ arising thereby on the bit line BL is stored temporarily in a capacitor CK1. The associated word line WL hereupon blocks the transfer transistor T of the read out memory cell.

In a second step II the bit line BL is then precharged at 0 V and the transfer transistor T of the memory cell is reopened through applying a word line pulse to the word line WL. A reference voltage $\Delta U_R$ is then generated on the bit line. This reference voltage is stored temporarily in a capacitor CK2.

Figure 1:
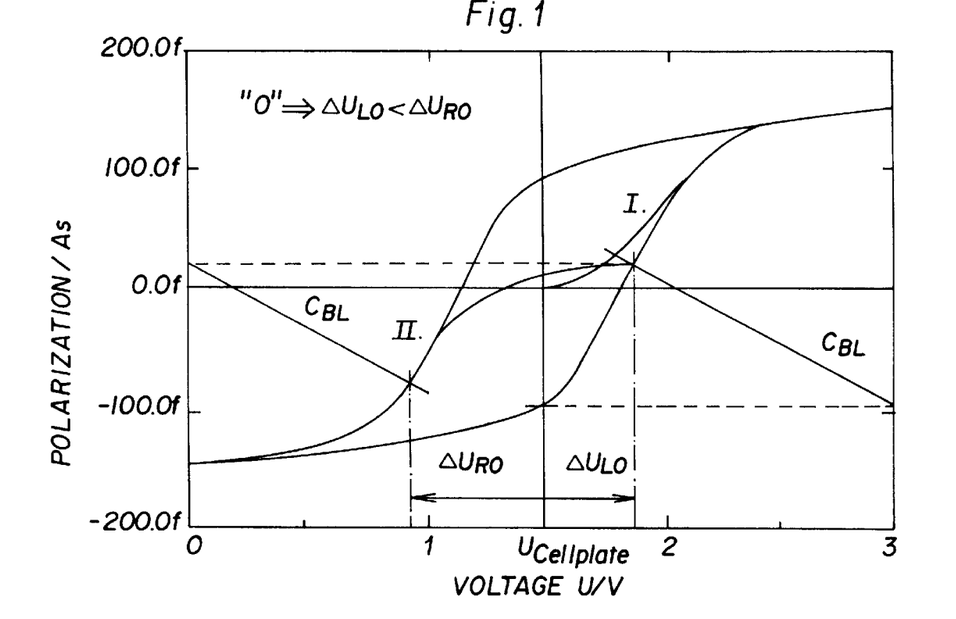
FIG. 1 is a graph illustrating the read-out of a "0" in a configuration according to a first exemplary embodiment of the invention with a fixed cellplate voltage.
Figure 2:
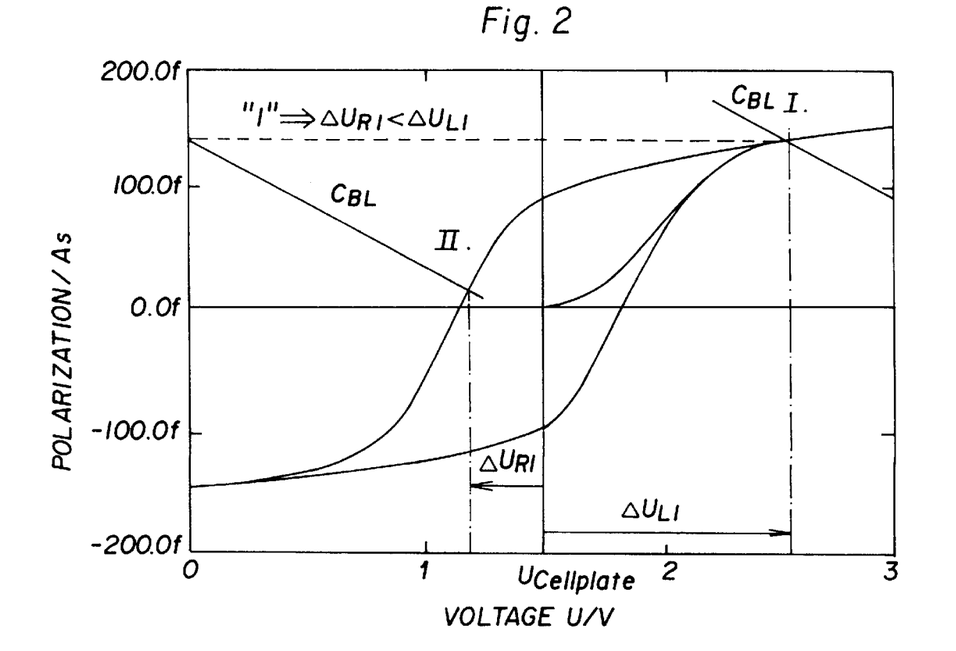
FIG. 2 is a graph illustrating the read-out of a "1" in the first exemplary embodiment.

The voltages $\Delta U_L$ and $\Delta U_R$ are referred to $V_{ref}=VCC/2$ as shown in FIGS. 1 and 2 as graphical solution of the read-out in Step I and Step II for a "0" and a "1". The solution thereby appears as intersection of the hysteresis curve of the ferroelectric memory cell and the bit line capacitance $C_{BL}$ drawn as a straight line starting once from +3 V and once from 0 V.

What is now important is that, referred to the reference voltage $V_{ref}=VCC/2$, a read voltage difference $\Delta U_{L0}$ for a stored "0" is initially obtained which is significantly smaller than the reference voltage difference $\Delta U_{R0}$ obtained at the second read-out (cf. FIG. 1). Conversely, a read voltage difference $\Delta U_{L1}$ for a stored "1" is obtained which is significantly greater than the reference voltage difference $\Delta U_{R1}$ obtained at the second read-out (cf. FIG. 2).

As is apparent from the diagrams of FIGS. 1 and 2, in the configuration according to the invention the entire range of the hysteresis curve, i.e. the range to the left and to the right of the "zero line", is utilized for determination of the read voltage and the reference voltage.

In order that the above relationships $$\text{"0"} \rightarrow \Delta U_{R0} > \Delta U_{L0} \quad (1)$$

$$\text{"1"} \rightarrow \Delta U_{R1} > \Delta U_{L1} \quad (2)$$

are maintained, the magnitude of the bit line capacitance $C_{BL}$ must be selected accordingly through appropriate configuration of the bit line BL. The permissible range of values for the bit line capacitance $C_{BL}$ is defined by the hysteresis curve of the ferroelectric cell capacitance (cf. FIGS. 1 and 2).

Figure 3:
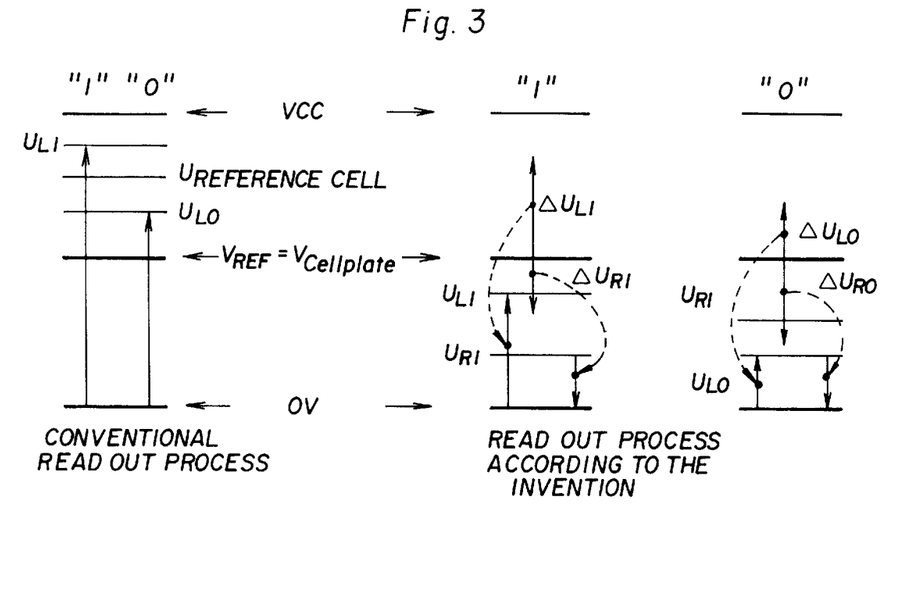
FIG. 3 is a graph illustrating the differences between the read-out process according to the invention (right-hand half of FIG. 3) and the read-out process of the prior art (left-hand half of FIG. 3)

The respective read voltage difference $\Delta U_{L1}$ for "1" and $\Delta U_{L0}$ for "0" and the associated reference voltage difference $\Delta U_{R1}$ for "1" and $\Delta U_{R0}$ for "0", which are referred to the cellplate voltage $V_{cellplate}=V_{ref}=VCC/2$, are now displaced such that both $U_L$ and $U_R$ are aligned on a joint voltage, for example 0 V as illustrated in FIG. 3 (right-hand side, dotted arrow), in order then to be applied directly to the two inputs of an evaluator circuit 1 (cf. FIG. 4), amplified, detected and written back to the memory cell.

As can be seen from FIG. 3, the differential voltage $U_L-U_R$ provided for the evaluation in the configuration according to the invention (right-hand side of FIG. 3) is greater than in the configuration of prior art.

FIG. 4 shows a first exemplary embodiment of the configuration according to the invention, as already mentioned above. The mode of operation of this configuration will be explained in the following with reference to FIG. 5.

Figure 5:
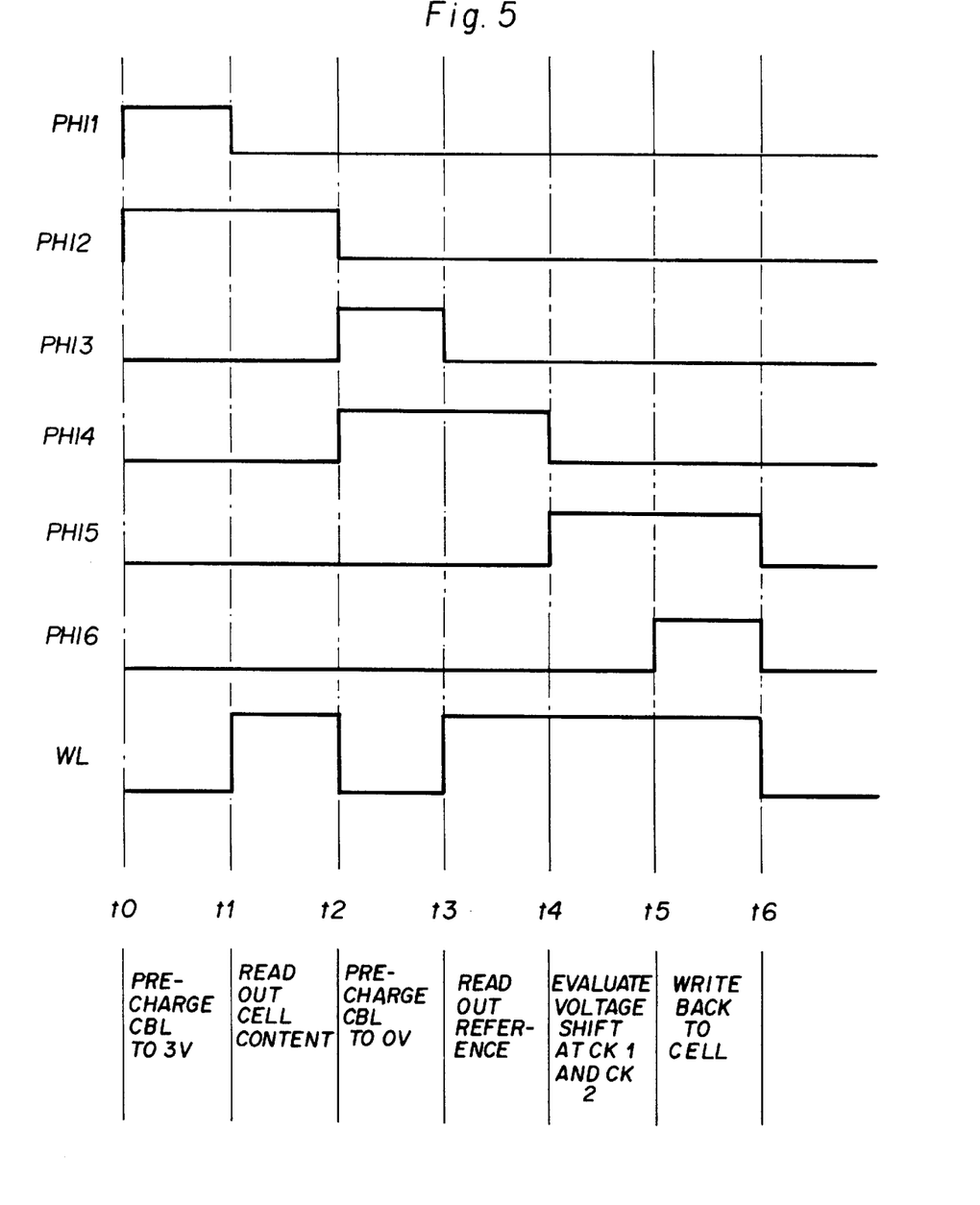
FIG. 5 is a graph illustrating the progression of signals at individual parts of the circuit configuration of FIG. 4.

First, during a time t0–t1, the bit line BL at 0 V is precharged to VCC, for example 3 V, through the use of a switch PHI1. Through the use of the switch PHI1 and a switch PHI2, the capacitance CK1 is precharged to 3 V or respectively VREF. At time t1 the switch PHI1 is deactivated.

During the period of time t1–t2 the content of the memory cell is read out of the ferroelectric storage capacitor FCS and the transfer transistor T onto the bit line BL and to the capacitor CK1 through the use of the word line WL and the switch PHI2. At time t2 the word line WL and the switch PHI2 are deactivated.

During the period of time t2–t3 the bit line BL is precharged to 0 V through the use of the switch PHI3 and the capacitor CK2 is brought to 0 V or VREF through the use of the switch PHI3 and a switch PHI4. At time t3 the switch PHI3 is deactivated.

During the period of time t3–t4 the current content of the memory cell is read out of the ferroelectric storage capacitor FCS and the transfer transistor T onto the bit line BL and to the capacitor CK2 through the use of the word line WL and the switch PHI4. At time t4 the switch PHI4 is deactivated.

During the period of time t4–t5 a switch PHI5 is activated. This results in a charge reversal or charge exchange between the bases of the capacitors CK1 and CK2 (cf. FIG. 3) and an activation of the evaluator circuit 1.

Finally, during the period of time t5–t6 a write-back by the evaluator circuit 1 into the storage capacitor FCS is effected through activation of a switch PHI6.

Figure 6:
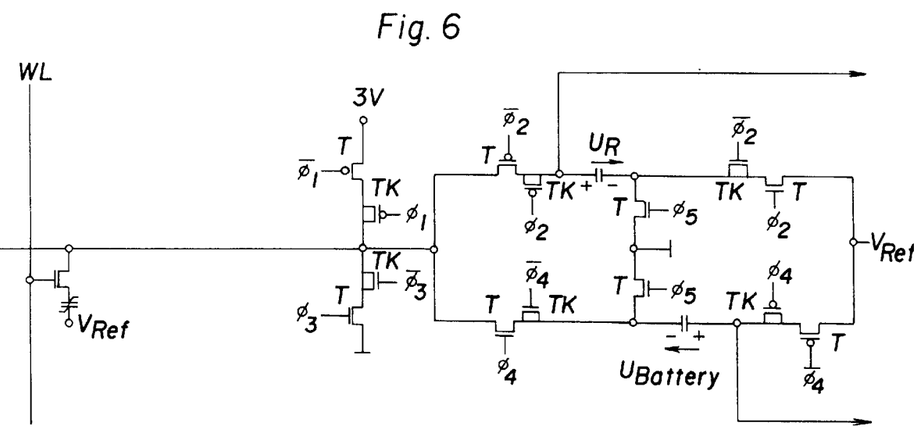
FIG. 6 is a diagram of a concrete circuit for implementing the circuit configuration illustrated in FIG. 4.

The individual switches PHI1 to PHI6 can, for example, be implemented in CMOS technology, as shown schematically in FIG. 6 with individual control signals $\phi_1$, $\phi_2$, $\phi_3$, $\phi_4$, $\bar{\phi}_1$, $\bar{\phi}_2$, $\bar{\phi}_3$, and $\bar{\phi}_4$. In this case, transfer transistors T and short-circuited transistors TK are used for the switches. Such transfer transistors T and short-circuited transistors TK are known, for example, from analog to digital converters. The short-circuited transistors used must be dimensioned to be half the size of the transfer transistors T and controlled with the inverse control signals $\bar{\phi}_1$ when the control signals $\phi_1$ are applied to the transfer transistors T.

It is easily possible to read-out the read voltage (Step I; cf. above) onto a bit line BL precharged to 0 V and then to generate the reference voltage through the bit line precharged to the supply voltage VCC. Also, the read voltage and the reference voltage are not restricted to a value of 0 V but can also be transformed to a different voltage reference point, e.g. the supply voltage VCC, if this is beneficial for the evaluator circuit.

The second exemplary embodiment will now be explained with reference to FIGS. 7 to 14. In this exemplary embodiment the cellplates are connected together in lines parallel to the bit lines and the cellplate lines are pulsed for read-out and write-back of the memory cell content.

Figure 7:
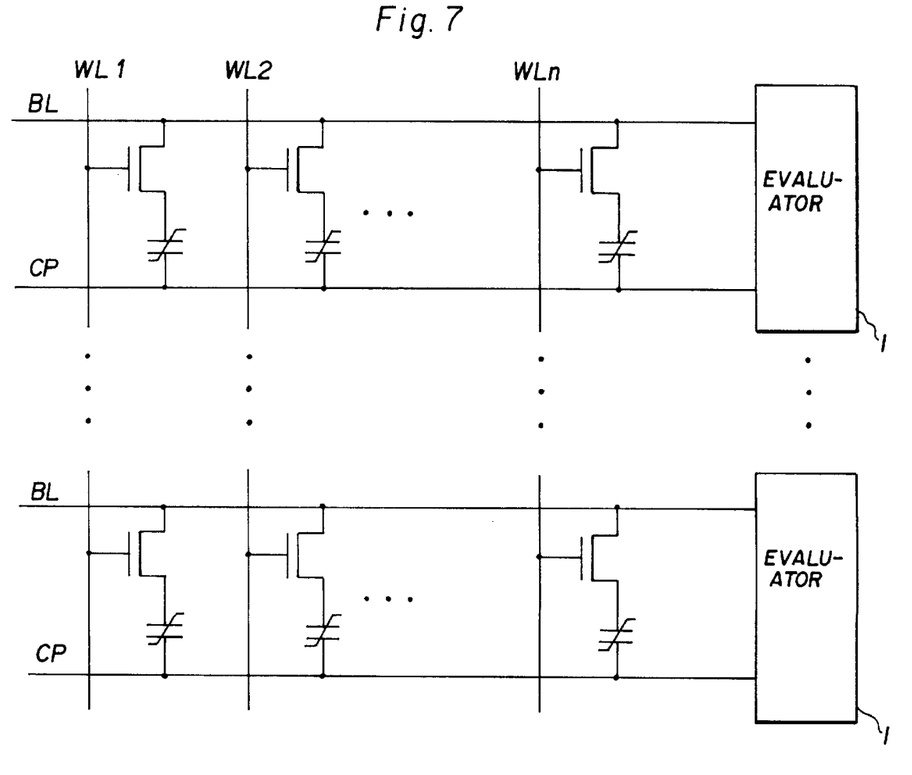
FIG. 7 is a schematic circuit diagram for explaining the basic layout of a ferroelectric memory array with cellplates connected in bit line direction according to a second exemplary embodiment of the invention.

Firstly, FIG. 7 shows the basic layout of a ferroelectric memory cell array with cellplates CP connected together in the At direction of the bit lines BL. This means that in this exemplary embodiment the cellplates CP of all cells are connected at the bit line BL with the evaluator circuit 1.

Figure 8:
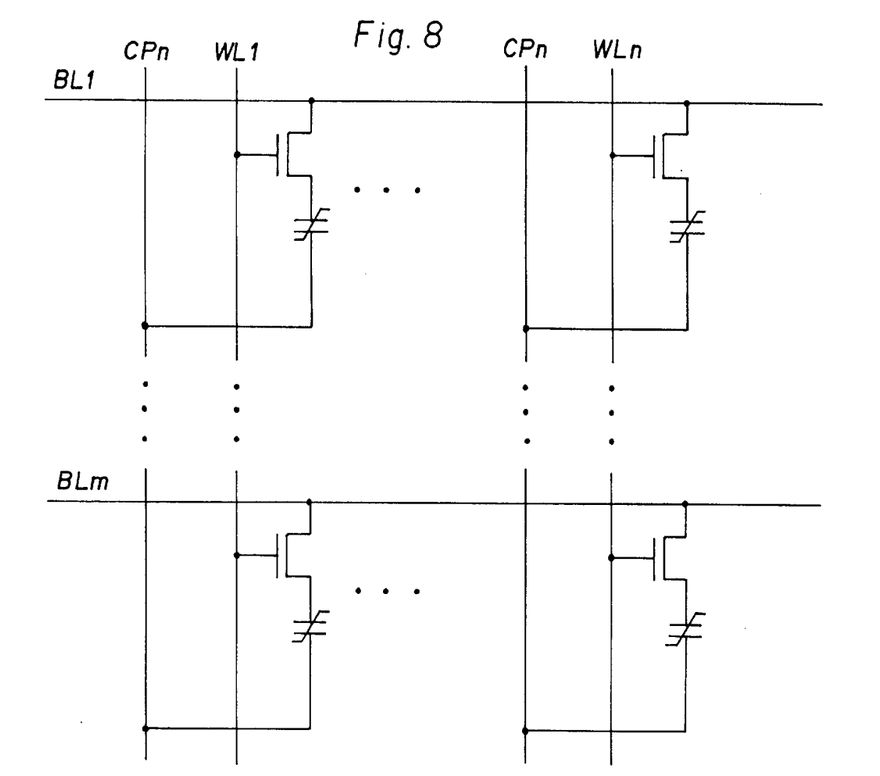
FIG. 8 is a schematic circuit diagram illustrating the basic layout of a ferroelectric memory array with cellplates connected in word line direction according to a third exemplary embodiment of the invention.

In contrast to this, FIG. 8 shows a circuit configuration of a ferroelectric memory cell array with cellplates CPn connected in the direction of word lines WL1, . . . , WLn. A memory cell array of this kind is used in the third exemplary embodiment, which is explained below.

In the second exemplary embodiment (cf. FIG. 11) a bit line BL is precharged in a Step I to, for example, supply voltage VCC. Then, the content of an addressed memory cell is read out of a ferroelectric storage capacitor FCS and a transfer transistor T onto this bit line BL. At the same time, the opposing voltage to the bit line voltage, i.e., for example, 0 V, is applied to the cellplate line CP. The voltage $\Delta U_L$ generated thereby from the bit line BL is stored temporarily in a capacitor CBSA. The associated word line WL then blocks the transfer transistor T of the read out memory cell.

Figure 11:
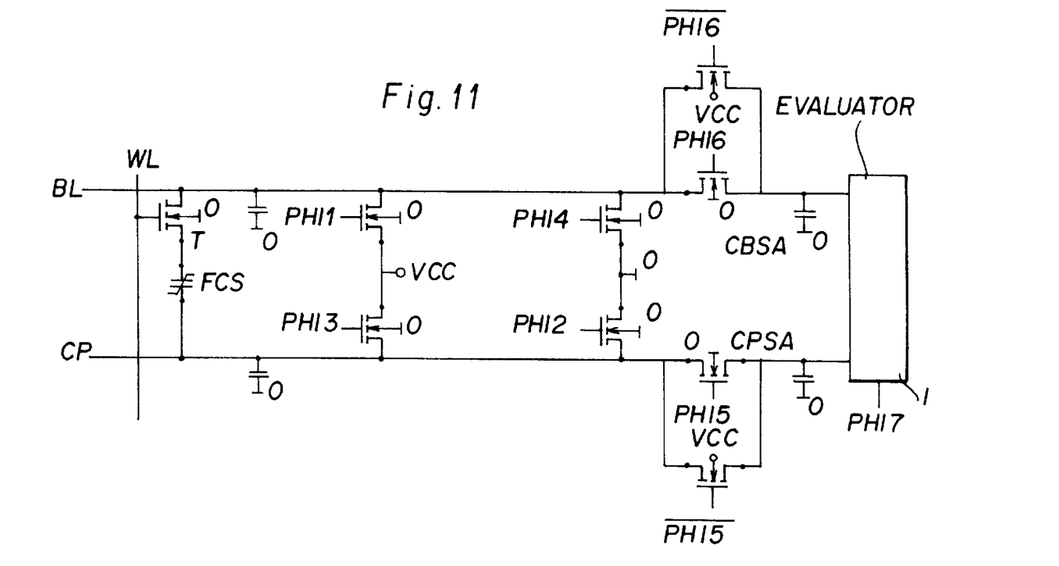
FIG. 11 a schematic circuit diagram of the configuration according to the second exemplary embodiment of the invention.

The bit line BL is then set to 0 V in a Step II. The cellplate line CP at the memory cell is then precharged to the voltage opposing the bit line voltage, i.e., for example, VCC, and the transfer transistor T of the memory cell is opened again by applying the word line pulse. A reference voltage $\Delta U_R$ then results on the cellplate line CP. This reference voltage $\Delta U_R$ is temporarily stored in a capacitor CPSA.

Figure 9:
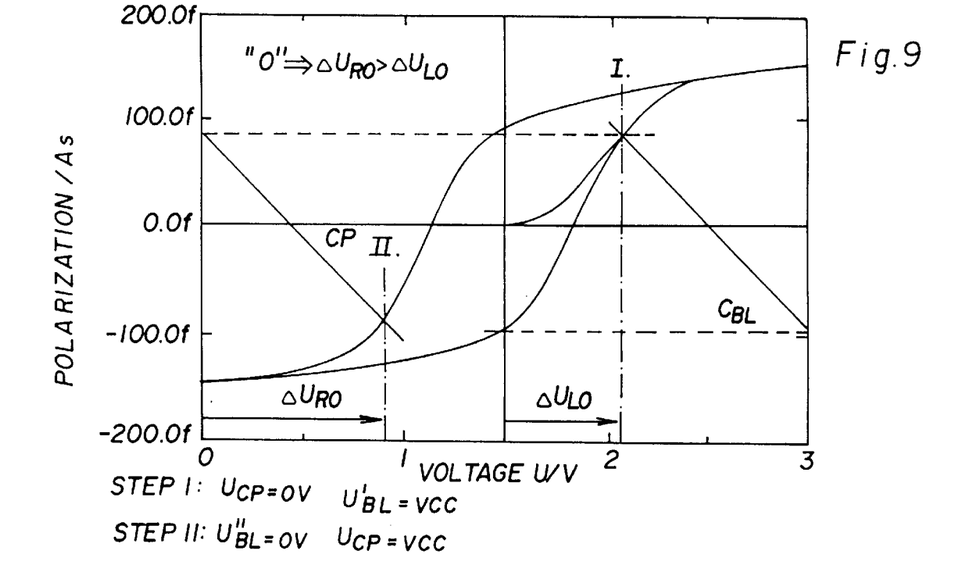
FIG. 9 is a graph illustrating the read-out of a "0" in the second exemplary embodiment of the invention.
Figure 10:
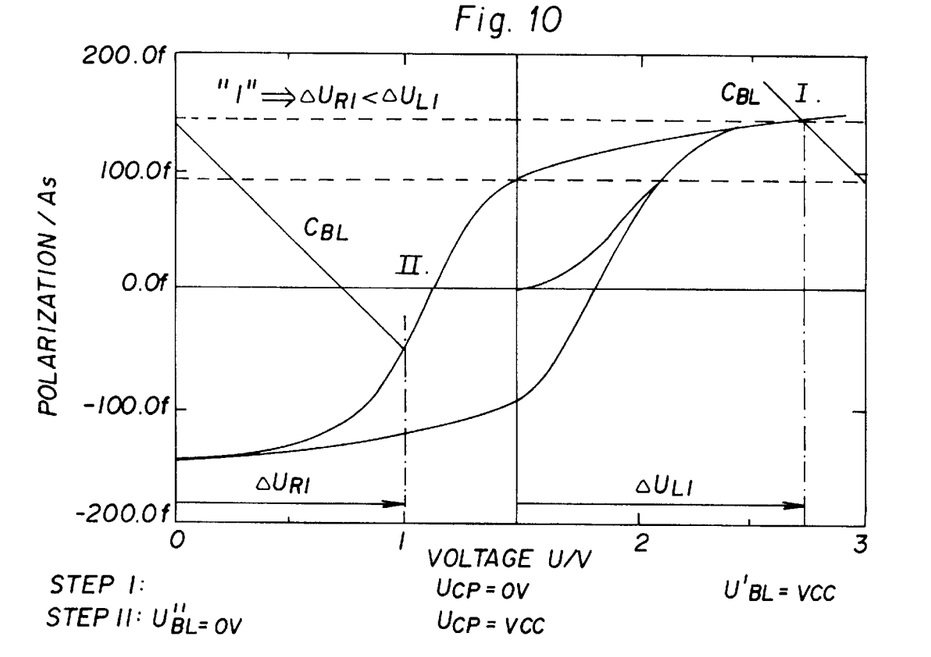
FIG. 10 is a graph illustrating the read-out of a "1" in the second exemplary embodiment of the invention.

In FIGS. 9 and 10 the above process is presented as graphical solution of the read-out in a Step I and a Step II for a "0" and a "1". The solution can be gathered from the intersection of the hysteresis curve of the ferroelectric storage capacitor FCS with the bit line capacitance CBL and the capacitance of the cellplate line CP respectively, drawn as a straight line once from a bit line voltage $U'_{BL}$=VCC and once from a bit line voltage $U''_{BL}$=0 V. A voltage $U_{CP}$ corresponds to 0 V in the Step I, whereas in the Step II it has the magnitude of the supply voltage VCC.

The important aspect of this exemplary embodiment is that, as in the first exemplary embodiment, a read voltage difference $\Delta U_{L0}$ is produced for a "0", which is smaller than the reference voltage difference $\Delta U_{R0}$ produced in the second read-out (cf. FIG. 9). Conversely, a read voltage difference $\Delta U_{L1}$ is produced for a "1", which is greater than the reference voltage difference $\Delta U_{R1}$ produced in the second read-out (cf. FIG. 10).

In other words, the same relationships (1) and (2) apply here as for the first exemplary embodiment above.

Through appropriate configuration, the magnitude of the capacitance of the bit line BL and the magnitude of the capacitance of the cellplate line CP can be easily set such that the above relationships (1) and (2) are maintained. The permissible range of values for the bit line capacitance CBL and for the capacitance of the cellplate line CP is defined by the hysteresis curve and by the capacitance of the ferroelectric storage capacitor FCS (cf. FIGS. 9 and 10).

Figure 12:
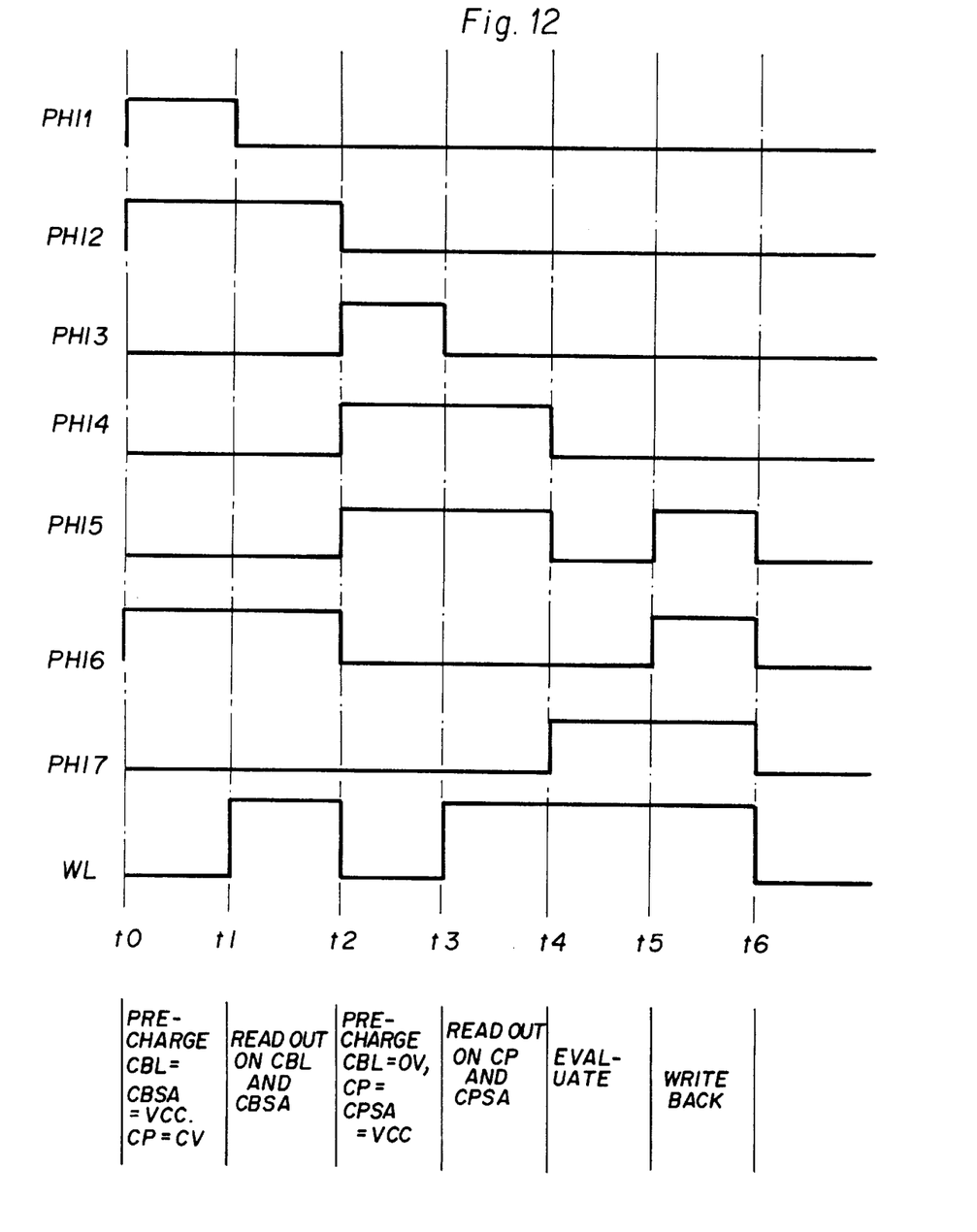
FIG. 12 is a graph illustrating the progression of signals at different positions in the configuration according to FIG. 11.

The operation of the configuration according to the invention as in the second exemplary embodiment will now be explained with reference to FIGS. 11 and 12.

During a time t0–t1 the bit line BL is precharged and the capacitor CBSA is brought to the level of the supply voltage VCC, for example 3 V, through the use of the switch PHI1 and the switches PHI6 and $\overline{PHI6}$. The cellplate line CP is set to 0 V through the use of the switch PHI2. At a time t1 the switch PHI1 is deactivated.

During a time t1–t2 the content of the storage capacitor FCS is read out onto the bit line BL through appropriate control of the word line WL and is stored in the capacitor CBSA. The switches PHI2 and PHI6 and respectively $\overline{PHI6}$ are deactivated at time t2.

During a time t2–t3 the cellplate line CP and the capacitor CPSA are precharged to the supply voltage VCC, i.e., for example, 3 V, through the use of the switches PHI3, PHI5 and $\overline{PHI5}$, and the bit line BL is brought to 0 V through the use of the switch PHI4. At a time t3 the switch PHI3 is deactivated.

During a period of time t3–t4 the current content of the storage capacitor FCS is read out onto the cellplate line CP and stored in the the capacitor CPSA in that the word line WL is controlled accordingly. At a time t4 the switches PHI4 and PHI5 and respectively $\overline{PHI5}$ are deactivated.

In a period of time t4–t5 a switch PHI7 is activated in order to activate the evaluator circuit 1.

Finally, during a period of time t5–t6, a write-back from the evaluator circuit 1 into the ferroelectric storage capacitor FCS is effected through activation of the switch PHI5 and respectively $\overline{PHI5}$ and the switch PHI6 and respectively $\overline{PHI6}$. Last of all, all the switches are deactivated.

The switch PHI5 and respectively $\overline{PHI5}$ and the switch PHI6 and respectively $\overline{PHI6}$ are selected to ensure that the full voltage VCC or 0 V can always be written back from the evaluator circuit 1 into the ferroelectric memory cell. In order to save space these switches are preferably realized through n-channel MOS transistors. In this case, however, the voltage of the pulses at the switches PHI5 and PHI6, and the pulse on the word line WL, should be raised.

The switches themselves can be realized in CMOS technology in a manner similar to that of the first exemplary embodiment.

It is also easily possible to perform the read-out of the read voltage (Step I) in an exactly opposite way to the above embodiment, i.e. first on a bit line BL precharged to 0 V and then to generate the reference voltage through a cellplate line CP precharged to VCC.

The precharging voltages, i.e. 0 V and the supply voltage VCC in the above example, can also be changed within the definition of the relationships "1" and "2" if this is advantageous for the evaluator circuit.

The cellplate line CP can easily be used jointly by two bit lines each, which allows the necessary chip area to be reduced considerably. An exemplary embodiment of this is illustrated in FIG. 13.

The capacitance of the bit line BL and the capacitance of the cellplate line CP do not have to have exactly the same magnitude—as illustrated in the FIGS. 9 and 10. Within the range of the hysteresis curve of the ferroelectric storage capacitor they can indeed have different magnitudes. Should this lead to problems with the detection, a second crossing can be implemented if necessary, as illustrated in FIG. 14.

Figure 13:
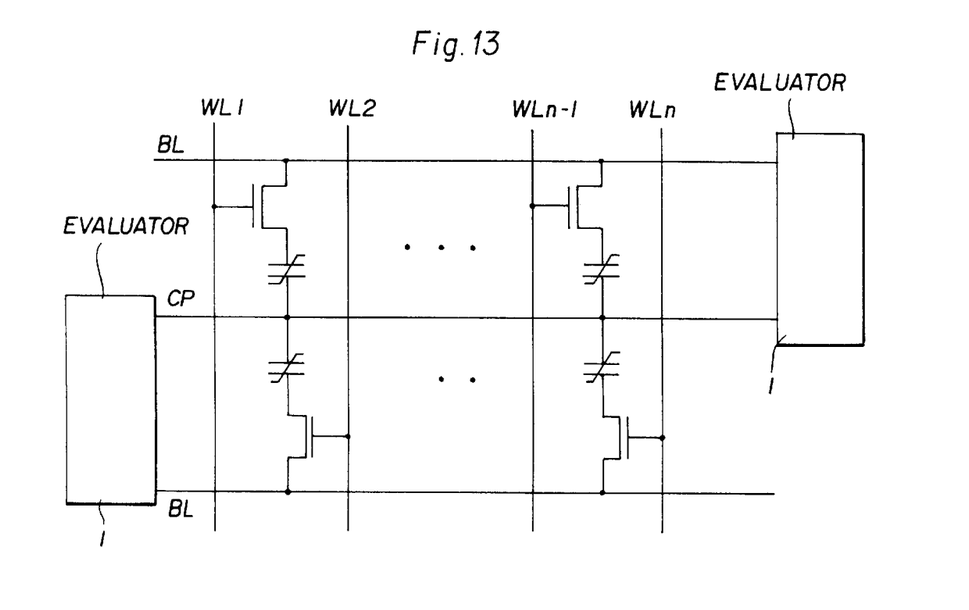
FIG. 13 is a schematic circuit diagram of a configuration with joint use of the cellplate line by two bit lines for reducing the cell area in the second exemplary embodiment of the invention.

In the exemplary embodiment of FIG. 13 the bit line BL and the cellplate line CP are connected with the selector transistor T and, respectively, the cellplate of the storage capacitors and are formed as a rule of different materials, for example polycrystalline silicon or aluminium, so that they have different capacitances. This is unfavourable for the detection of the read signal.

Figure 14:
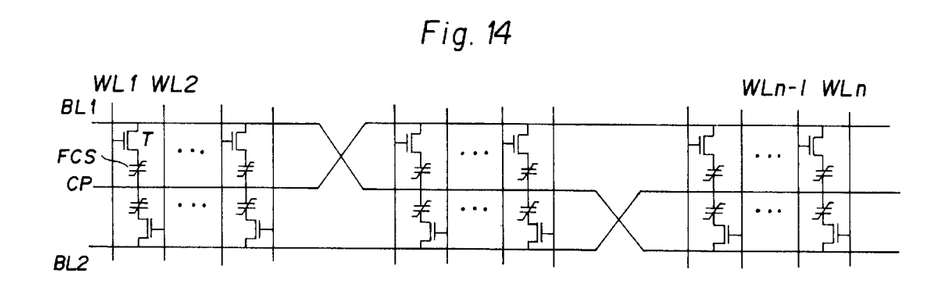
FIG. 14 is a circuit diagram of a configuration with equally large capacitances of the bit lines and the cellplate line through double crossing in the second exemplary embodiment of the invention.

This problem can also be solved through a configuration in accordance with FIG. 14. Here, the cellplate line CP and the two associated bit lines BL1, BL2 are crossed with one another such that the capacitances for the bit lines BL1, BL2 and that of the cellplate line CP are of equal magnitude.

The third exemplary embodiment of this invention is explained in the following with reference to FIGS. 8 to 10, 15 and 16. In this third exemplary embodiment the cellplates are connected together parallel to the word lines WL and the cellplates are pulsed for read-out and write-back of the memory cell content.

Figure 15:
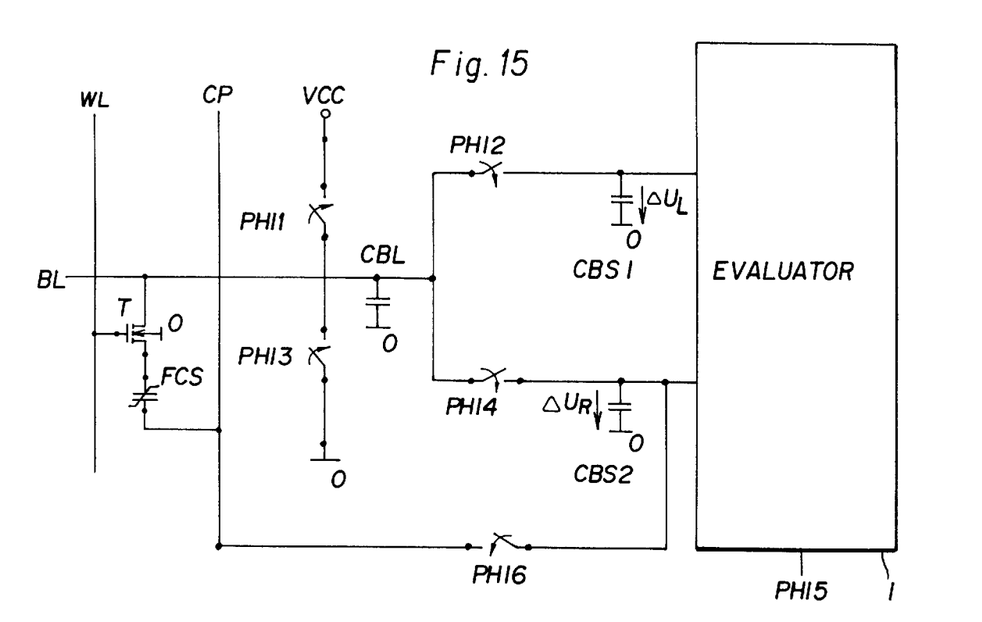
FIG. 15 is a schematic circuit diagram for explaining the basic layout of a read-out circuit in the third exemplary embodiment of the invention.

In the third exemplary embodiment as well, a bit line is charged to, e.g., the level of the supply voltage VCC in a step I (cf. FIG. 15). Then the content of an addressed memory cell with the storage capacitor FCS is read out onto this bit line BL through activation of the word line WL. At the same time the cellplate line CP should be set to the voltage opposite to the voltage with which the bit line is biased, i.e., for example, the cellplate line CP should be set to 0 V. The voltage $\Delta U_L$ generated on the bit line BL as a result is temporarily stored in a capacitor CBS1.

The associated word line WL then blocks the read-out or transfer transistor T of the read out memory cell.

In a Step II the bit line BL is then set to 0 V. The cellplate line CP at the memory cell is precharged to the voltage (i.e., for example, VCC) opposite to the voltage with which the bit line BL was precharged and the transfer transistor T of this memory cell is opened again by applying a word line pulse to the word line WL.

A reference voltage $\Delta U_R$ now arises on the bit line BL, which is stored temporarily in a capacitor CBS2.

The above process is displayed again in the FIGS. 9 and 10, which represent a graphical solution of the read-out in Step I and Step II for a "0" and a "1". As for the second exemplary embodiment, the solution appears as intersection of the hysteresis curve of the ferroelectric storage capacitor and the bit line capacitance CBL of the bit line BL drawn as a straight line, once from $U'_{BL}=VCC$ and once from $U''_{BL}=0$ V. The voltage $U_{CP}$ thereby corresponds once more to the value 0 V in Step I and the supply voltage VCC, i.e., for example, 3 V, in Step II.

In this exemplary embodiment too, the relationships (1) and (2) are valid, as in the first and the second exemplary embodiment.

Here too, the bit line capacitance CBL of the bit line BL should be selected through appropriate configuration such that the relationships (1) and (2) are maintained. As in the preceding exemplary embodiments, the permissible range of values for the bit line capacitance CBL is defined through the hysteresis curve of the ferroelectric storage capacitor FCS (cf. FIGS. 9 and 10).

Figure 16:
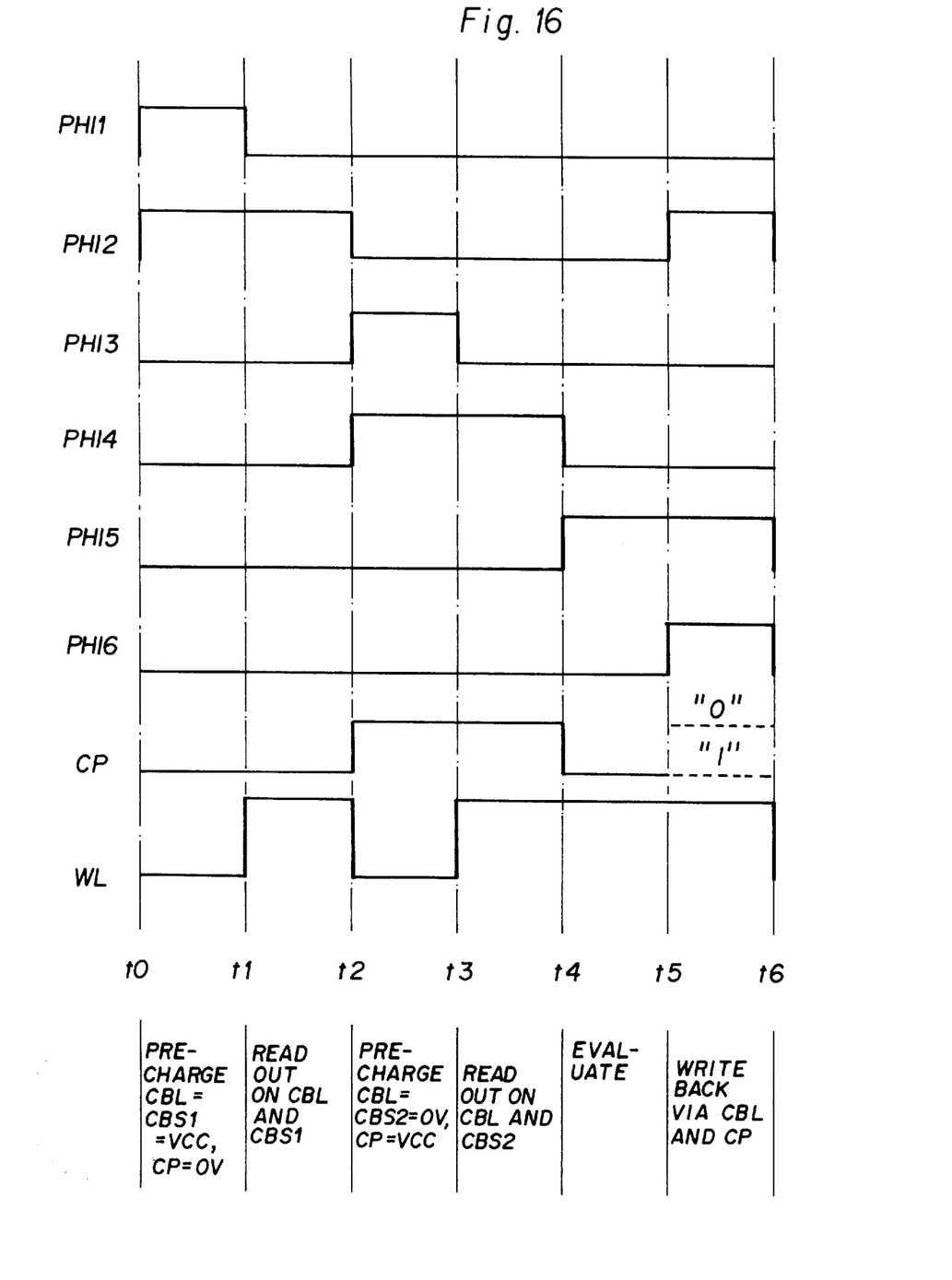
FIG. 16 is a graph illustrating the progression of signals at different positions of the circuit illustrated in FIG. 15.

The mode of operation of the configuration according to the invention in the third exemplary embodiment is explained below in detail with respect to FIGS. 15 and 16.

First, during a period of time t0–t1, the bit line BL and a capacitance CBS1 are charged to a supply voltage VCC, i.e., for example, 3 V, through the use of the switches PHI1 and PHI2, whereby the cellplate line CB is at a level of 0 V. At the time t1 the switch PHI1 is deactivated.

Then, in a period of time t1–t2, the content of the storage capacitor FCS is read out onto the bit line BL and the capacitance CBS1 through appropriate control of the word line WL. At time t2 the switch PHI2 is opened and the word line WL is switched off.

During a subsequent period of time t2–t3 the cellplate line CP is activated with VCC, i.e. 3 V. The bit line BL and a capacitor CBS2 are charged to 0 V through the use of the switch PHI3 and PHI4, respectively. At time t3 the switch PHI3 deactivated.

During a subsequent period of time t3–t4, the current content the ferroelectric storage capacitor FCS is read out onto the bit line BL and the capacitor CBS2 through an appropriate control of the word line WL. At time t4 the switch PHI4 is deactivated.

During a period of time t4–t5 the evaluator circuit 1 is activated through the use of the switch PHI5.

Finally, during a period of time t5–t6, a write-back takes place from evaluator circuit 1 into the ferroelectric storage capacitor FCS through activation of the switches PHI2 and PHI6 and of the word line WL. Last of all, all switches are deactivated at a time t6.

As in the preceding exemplary embodiments, the switches preferably are formed of a combination of n- and p-channel MOS transistors. These are selected such that the full voltage, i.e., for example, the supply voltage VCC and 0 V, can always be written into the capacitors CBS1 and, respectively, CBS2 or from the evaluator circuit 1 into the storage capacitor FCS. In order to reduce the space requirement, n-channel MOS transistors alone can also be used. In this case, however, the voltage of the pulses at the switches and the word line pulse on the word line WL should be raised.

In this exemplary embodiment too, the read-out of the read voltage (Step I) can be executed exactly oppositely to the example explained above, as was described for the second exemplary embodiment. The same also applies for changes to the precharging voltages or bias voltages within the context of the above relationships (1) and (2). Finally, it is also possible for the third exemplary embodiment that the cellplate line is used jointly by two word lines, which allows a considerable reduction in the chip area.

We claim:

1. A configuration for self-referencing a memory cell, comprising:

a ferroelectric memory cell including a ferroelectric storage capacitor and a transfer transistor, said ferroelectric storage capacitor having a cellplate;

a bit line connected to said ferroelectric memory cell, said bit line being precharged with a first voltage having a first voltage value and subsequently with a second voltage having a second voltage value, the first and second voltages being opposite and different from one another;

a cellplate line, said ferroelectric storage capacitor being connected between said cellplate line and said transfer transistor;

a first capacitor and a second capacitor, said first capacitor temporarily storing a first read-out voltage value read from said ferroelectric memory cell while said bit line is precharged with the first voltage value, and said second capacitor temporarily storing a second read-out voltage value read from said ferroelectric memory cell after said bit line is precharged with the second voltage value; and an evaluator circuit connected to said first capacitor and to said second capacitor, said evaluator circuit receiving the first and second read-out voltage values after being temporarily stored by said first and second capacitors, said evaluator circuit comparing the first and second read-out voltage values for determining a stored cell content by self-referencing said ferroelectric memory cell.

2. The configuration according to claim 1, wherein said cellplate line is connected to a fixed supply voltage.

3. The configuration according to claim 1, wherein said cellplate line is supplied with the first voltage when said bit line is supplied with the second voltage.

4. The configuration according to claim 3, including:

further cellplates and further bit lines; and said cellplate and said further cellplates being connected to one another in lines parallel to said bit line and said further bit lines, and the reference voltage being determinable on said cellplate line.

5. The configuration according to claim 3, including:

further cellplates and word lines; and said cellplate and said further cellplates being connected to one another in lines parallel to said word lines, and the reference voltage being determinable on said bit line.

6. The configuration according to claim 1, wherein said cellplate line is supplied with the second voltage when said bit line is supplied with the first voltage.

7. The configuration according to claim 6, including:

further cellplates and further bit lines; and said cellplate and said further cellplates being connected to one another in lines parallel to said bit line and said further bit lines, and the reference voltage being determinable on said cellplate line.

8. The configuration according to claim 6, including:

further cellplates and word lines; and said cellplate and said further cellplates being connected to one another in lines parallel to said word lines, and the reference voltage being determinable on said bit line.

9. The configuration according to claim 1, wherein said transfer transistor is blocked after said bit line is precharged with the first voltage.

10. The configuration according to claim 1, including:

further cellplate lines and further bit lines; and a respective one of said cellplate line and said further cellplate lines being used jointly by respective two of said said bit line and said further bit lines.

11. The configuration according to claim 1, including:

further cellplate lines and further bit lines; and said bit line and said further bit lines respectively being crossed at least once with said cellplate line and said further cell plate lines.

12. The configuration according to claim 1, wherein said bit line is precharged with a supply voltage as the first voltage and with 0 V as the second voltage.

13. The configuration according to claim 1, including:

further bit lines and word lines;

a memory cell array formed of said ferroelectric memory cell and further ferroelectric memory cells; and said memory cell array being controlled by said word lines, said bit line and said further bit lines.

* * * * *